(12) United States Patent
Park

(10) Patent No.: US 11,764,319 B2
(45) Date of Patent: Sep. 19, 2023

(54) METHOD OF MANUFACTURING SOLAR CELL WITH INCREASED POWER GENERATION AREA

(71) Applicant: SOLARFLEX CO., LTD., Asan-si (KR)

(72) Inventor: Ki Ju Park, Asan-si (KR)

(73) Assignee: SOLARFLEX CO., LTD., Asan-si (KR)

( * ) Notice: Subject to any disclaimer, the term of this patent is extended or adjusted under 35 U.S.C. 154(b) by 86 days.

(21) Appl. No.: 17/556,171

(22) Filed: Dec. 20, 2021

(65) Prior Publication Data
US 2022/0209030 A1 Jun. 30, 2022

(30) Foreign Application Priority Data
Dec. 24, 2020 (KR) .......................... 10-2020-0183923

(51) Int. Cl.
*H01L 31/0236* (2006.01)
*H01L 31/18* (2006.01)
*H01L 31/0392* (2006.01)
*H01L 31/20* (2006.01)

(52) U.S. Cl.
CPC .. *H01L 31/02363* (2013.01); *H01L 31/02366* (2013.01); *H01L 31/03926* (2013.01); *H01L 31/1864* (2013.01); *H01L 31/206* (2013.01)

(58) Field of Classification Search
CPC ......... H01L 31/02363; H01L 31/02366; H01L 31/03926; H01L 31/1864; H01L 31/206; H01L 31/208; H01L 31/18; H01L 31/1896
See application file for complete search history.

(56) References Cited

U.S. PATENT DOCUMENTS

| | | | |
|---|---|---|---|
| 2001/0044163 A1* | 11/2001 | Tsukuda ............ | H01L 31/02363 257/E31.13 |
| 2012/0233831 A1* | 9/2012 | Tsuji ..................... | H01L 31/206 29/33 R |
| 2022/0209030 A1* | 6/2022 | Park ...................... | H01L 31/206 |

FOREIGN PATENT DOCUMENTS

| | | | | |
|---|---|---|---|---|
| EP | 2429003 A1 * | 3/2012 | ....... | H01L 31/02363 |
| JP | H11-145491 A | 5/1999 | | |
| JP | 2000-252510 A | 9/2000 | | |
| JP | 2000252510 A * | 9/2000 | ....... | H01L 31/03529 |
| KR | 10-2009-0017760 A | 2/2009 | | |
| KR | 10-2009-0068110 A | 6/2009 | | |
| KR | 10-1039918 B1 | 6/2011 | | |
| KR | 10-2011-0114036 A | 10/2011 | | |
| KR | 10-2011-0124939 A | 11/2011 | | |
| KR | 10-2012-0111333 A | 10/2012 | | |
| KR | 10-1675931 A | 11/2016 | | |
| KR | 10-2020-0119518 A | 10/2020 | | |
| WO | WO-2011102345 A1 * | 8/2011 | ....... | H01L 31/02363 |

* cited by examiner

*Primary Examiner* — Earl N Taylor
(74) *Attorney, Agent, or Firm* — NKL Law; Jae Youn Kim

(57) ABSTRACT

Discloses is a method of manufacturing a solar cell with an increased power generation area to increase the area used for actual power generation without increasing the size of the solar cell.

5 Claims, 6 Drawing Sheets

METHOD OF MANUFACTURING SOLAR CELL WITH INCREASED POWER GENERATION AREA

BACKGROUND OF THE INVENTION

1. Field of the Invention

The present invention relates to a method of manufacturing a solar cell with an increased power generation area, and particularly, to a method of manufacturing a solar cell with an increased power generation area to increase the area used for actual power generation without increasing the size of the solar cell.

2. Description of the Related Art

As interest in and use of renewable energy are rapidly increasing, interest in and use of photovoltaic power generation has also increased remarkably and recently. In particular, recently, the number of cases of power generation using the photovoltaic power generation, which is easier to install and use compared to other renewable energy sources, is increasing significantly.

The technology for a battery panel having a longer lifespan and higher efficiency than the related art has been developed and further accelerated. However, power generation using the battery panel is still performed only during some hours of the day, so a large area is required to obtain a large amount of power despite fewer restrictions on the installation location compared to other renewable energy sources.

To solve the above restrictions, there are attempts to, for example, change materials of the battery panel or utilize building roofs or unused bare land, however, each of the attempts has its pros and cons and limitations.

In other words, the method for increasing the power generation efficiency is required, and there is an attempt to develop a structure capable of increasing the power generation area in the same installation area, as the way for increasing the power generation efficiency.

(Patent Document 1) Korean Unexamined Patent Publication No. 10-2020-0119518 (Published on Oct. 20, 2020) titled by SOLAR POWER GENERATING DEVICE.

SUMMARY OF THE INVENTION

Accordingly, the present invention provides a method of manufacturing a solar cell with an increased power generation area to increase the area used for actual power generation without increasing the size of the solar cell.

The method of manufacturing a solar cell according to the present invention includes: a substrate supply step; a protrusion forming step of forming a protrusion on a substrate; a step of sequentially forming a plurality of layers constituting a solar cell on the substrate on which the protrusion is formed; and recovering the substrate on which the layers are formed.

In the substrate supply step or the substrate recovery step, the substrate is wound in the form of a roll.

In the protrusion forming step, the protrusion is formed by pressing the substrate.

In the protrusion forming step, the substrate is pressed by a rolling roller.

The step of forming the layers includes a plurality of deposition equipment disposed on a moving path of the substrate determined by a transfer roller to sequentially form the layers.

The deposition equipment includes: a drum disposed inside a firing furnace and mounted thereon with the substrate to heat the mounted substrate during transfer; and a target spaced apart from an outer circumference of the drum, and having a material for forming any one of the layers.

The target is provided with a plurality of targets along the moving path of the substrate.

In the step of forming the layers, post-processing is performed by an annealing equipment on the substrate on which the one of the layers is formed.

The method of manufacturing a solar cell with an increased power generation area according to the present invention can allow easily produce solar cells with an increased power generation area, so that the amount of power generation using the solar cells can be increased, and the unit cost of power generation using the solar cells can be decreased.

DETAILED DESCRIPTION OF THE INVENTION

Figure 1:
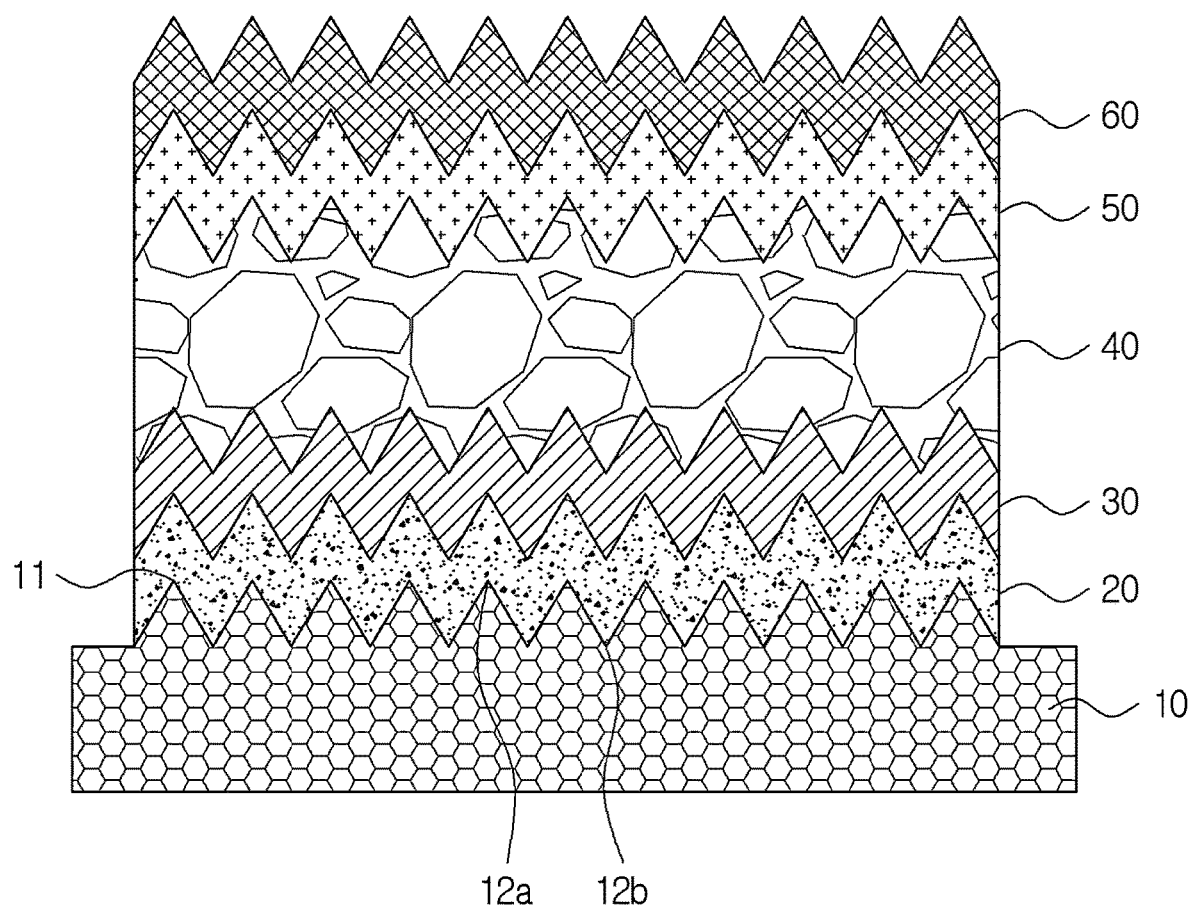
FIG. 1 is an exemplary view showing a sectional structure of a solar cell with an increased power generation area according to a first embodiment.

Hereinafter, the embodiments of the present invention will be described with reference to the accompanying drawings such that the present invention may be easily carried out by a person having ordinary skill in the art. In the accompanying drawings, it will be noted that the reference numeral in the configuration denotes same reference numerals in the other drawings as possible. In addition, upon describing the present invention, a detailed description will be omitted when it is determined that the detailed description on a related known function or known configuration possibly makes the subject matter of the present invention unclear unnecessarily. In addition, some features shown in the drawings are enlarged, reduced or simplified for easy description, and the drawings and elements thereof are not always drawn in an appropriate scale. However, those skilled in the art will readily understand those details.

FIG. 1 is an exemplary view showing a sectional structure of a solar cell with an increased power generation area according to a first embodiment.

Referring to FIG. 1, the solar cell with an increased power generation area according to the first embodiment of the present invention includes a substrate 10, an insulating layer 20, a back electrode 30, an absorption layer 40, a buffer layer 50, and a front electrode 60.

The insulating layer 20, the back electrode 30, the absorption layer 40, the buffer layer 50, and the front electrode 60 are sequentially laminated on one surface of the substrate 10, so that the solar cell panel is formed. The substrate 10 is formed of a flexible material. In particular, a three-dimensional structure is formed by processing the plate-shaped substrate 10 in order to expand the power generation area. The substrate 10 may be a metal plate processed as a thin plate to have flexibility. For example, the substrate may be an alloy plate that is strong against corrosion like stainless steel and has less breakage even when bent. Besides, the substrate may be formed to have a thin plate shape by processing a single metal having excellent processing and mechanical properties as described above. Alternatively, the substrate 10 also may be formed by using a synthetic resin.

The three-dimensional structure formed on the substrate 10 may be a protrusion 11 formed by protruding a portion of the substrate 10. The substrate 10 is rolled or extruded to form the protrusion 11. When the substrate is formed using a metal, the protrusion 11 may be formed using rolling or extrusion. In the case of a synthetic resin, the substrate formed with the protrusion 11 may be manufactured by extrusion and injection. Hereinafter, for convenience of description, the description will be mainly focused on the substrate 10 manufactured using an alloy metal such as stainless steel.

The insulating layer 20 is formed on one surface of the substrate 10. The insulating layer 20 is formed to have a predetermined thickness so as to maintain the formation of the protrusion 11 formed on the substrate 10. To this end, the insulating layer 20 is formed using a deposition process. In particular, according to the present invention, the description will proceed based on examples formed by sputtering with respect to all of the back electrode 30, the absorption layer 40, the buffer layer 50, and the front electrode 60 in addition to the insulating layer 20. However, the present invention is not limited thereto. Other processes may be available, as long as the processes can form a film having a predetermined thickness on the substrate 10, and the insulating layer 20 may be formed by applying another deposition scheme. The insulating layer 20 serves to provide insulation between the back electrode 30 and the substrate 10 and prevent impurities from permeating into the absorption layer 40.

The rear electrode 30 is laminated on the insulating layer 20, and formed using a metal such as copper (Cu) or molybdenum (Mo). The rear electrode 30 is also formed using sputtering so as to be formed as a thin film having a predetermined thickness on the insulating layer 20.

The absorption layer 40 is formed on the rear electrode 30 and electrically connected to the rear electrode 30. Light of the absorption layer 40 is absorbed to produce photovoltaic power together with the buffer layer 50. The absorption layer 40 may be a P-type semiconductor in which a hole is formed by synthesizing a material such as gallium (Ga) or indium (in) in silicon (Si). When the absorption layer 40 is manufactured using silicon (Si), a heat treatment process such as annealing may be performed in a subsequent process. In particular, according to the present invention, the absorption layer 40 may be a Cu—In—Ga—Se (CIGS)-based compound semiconductor, or may be a compound semiconductor such as copper zinc tin sulfide (CZTS) or zinc tin selenium copper (CZTSe).

The buffer layer 50 is formed as a thin film on the absorption layer 50 and electrically connected to the absorption layer 40 and the front electrode 60. The buffer layer 50 produces photoelectro-motive force together with the absorption layer 40. The buffer layer 50 may be an N-type semiconductor in which a material such as antimony (Sb) or arsenic (As) is doped with silicon (Si). Alternatively, when the absorption layer 40 is composed of a compound semiconductor, the buffer layer 50 may be formed using a metal such as a tinned metal or a selenized metal.

The front electrode 60 is formed on the buffer layer 50. The front electrode 60 is electrically connected to the buffer layer 50 to collect the photoelectro-motive force generated in the buffer layer 50. To this end, the front electrode 60 is formed using a transparent electrode, or formed on the front electrode 60 by using a general metal in a form in which light may be supplied to the front electrode 60. For example, when an opaque metal is used as a material for the front electrode 60, the front electrode is formed in a form, such as a matrix form, provided with a space through which light can pass.

Further, an encapsulation layer may be formed to cover the front electrode 60 and the buffer layer 50, however, the present invention is not limited thereto.

The solar cell of this first embodiment is shown in FIG. 1. As described above, the protrusion 11 is formed on the substrate 10, and a shape of the protrusion 11 is maintained to form each layer so as to be in phase with the substrate. Accordingly, the shape of the protrusion 11 is also exhibited in the absorption layer 30 and the buffer layer 40, and the contact area between the absorption layer 30 and the buffer layer 40 is increased by the shape of the protrusion 11. Accordingly, the production of the photoelectro-motive force is remarkably increased compared to the case without the protrusion 11.

Meanwhile, the present invention has described the example in which the protrusion 11 is formed by press-fitting or extrusion, however, the above protrusion 11 may be formed on the substrate 10 through partial etching using a semiconductor manufacturing process. However, in the above case, the production slows down, production cost increases, and it is difficult to produce a battery panel of more than a certain area.

According to the above-described first embodiment, a pointed portions 12a and 12b are formed. In other words, the pointed portion 12a having a sharp shape at an end of the protrusion 11, and a pointed portion 12b formed in a valley between the protrusion 11 and the protrusion 11 may be formed. When the protrusion 11 and the protrusion 11 are formed with a predetermined interval, an inflection point such as the pointed portion 12 also may be formed between the substrate 10 and the protrusion 11.

The above pointed portion 12 causes to prevent the shape of the protrusion 11 from being maintained in the process of using sputtering, particularly other depositions such as vapor deposition. For example, when an electromagnetic field is formed in the deposition process of the substrate 10, such as metal chemical vapor deposition, the electric field or magnetic field is concentrated in the pointed portion 12, thereby failing to form a uniform thin film. In particular, when the sputtering is used, a metal material cannot be accumulated according to the angle of the pointed portion 12, thereby becoming thin. The shape of the protrusion 11 may disappear in a layer far from the substrate 10, for example, the buffer layer 40 or the front electrode 50. In order to solve these problems, the battery panel of the second embodiment as shown in FIG. 2 may be manufactured.

Figure 2:
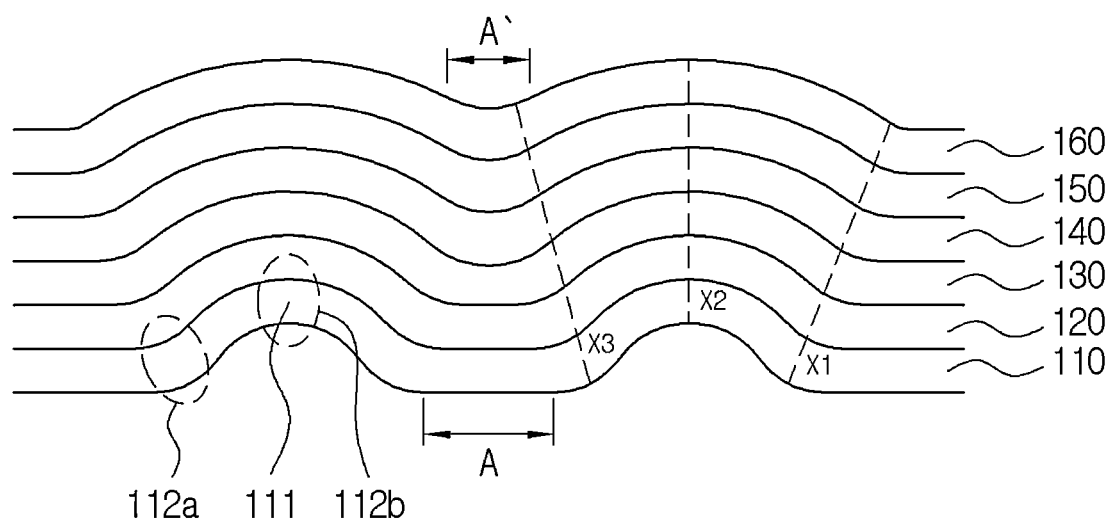
FIG. 2 is an exemplary view showing a sectional structure of a solar cell with an increased power generation area according to a second embodiment.

FIG. 2 is an exemplary view showing a sectional structure of a solar cell with an increased power generation area according to a second embodiment.

Upon describing the second embodiment in FIG. 2, the descriptions of the same contents as those of the above-described first embodiment will be omitted, and differences will be mainly described.

A protrusion 111 is formed on a substrate 110 of the second embodiment. The protrusion 111 is spaced apart from an adjacent protrusion 111 and has a gap A. The above protrusion 111 is formed in a hemispherical shape as shown in the drawings, in which a crest 112*b* and a side part 112*a* connected between the crest 112*b* and the valley as the gap portion may be formed in an arc shape, and both of the crest 112*b* and the side part 112*a* are rounded to prevent the pointed portions from being formed. Meanwhile, the crest 112*b* portion may be formed flat, so that the protrusion 111 is formed in a disc shape, or modification may be available such that the sharp part is not formed, that is, the inflection point is rounded.

As described above, the protrusion 111 formed on the substrate 110 is formed to have a gap with respect to the adjacent protrusion 111. Each layer is laminated gradually upward in the valley (corresponding to A) at the position corresponding to the protrusion 111, and accordingly, the gap A becomes narrower. In other words, when gap A' of the substrate 110 is compared with gap A' provided between protrusions of the front electrode 160, gap A' of the front electrode 160 becomes narrower than gap A of the substrate 110. For this reason, the protrusions 111 formed on the substrate 110 are formed spaced apart at intervals calculated experimentally while considering the thickness of the insulating layer 120, the back electrode 130, the absorption layer 140, the buffer layer 150, and the front electrode 160 laminated on the substrate 110.

Figure 3:
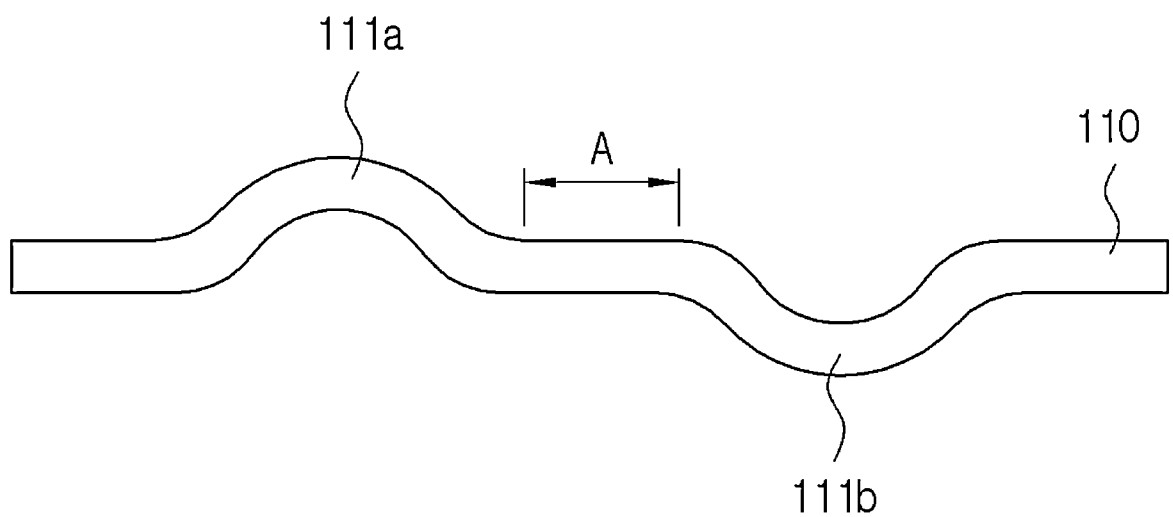
FIG. 3 is an exemplary view showing another example of forming a protrusion.

Meanwhile, FIG. 3 is an exemplary view showing another example of forming the protrusion. As shown in FIG. 3, the protrusions 111 may be alternately formed to protrude from front and rear surfaces of the substrate 110, respectively.

Figure 4:
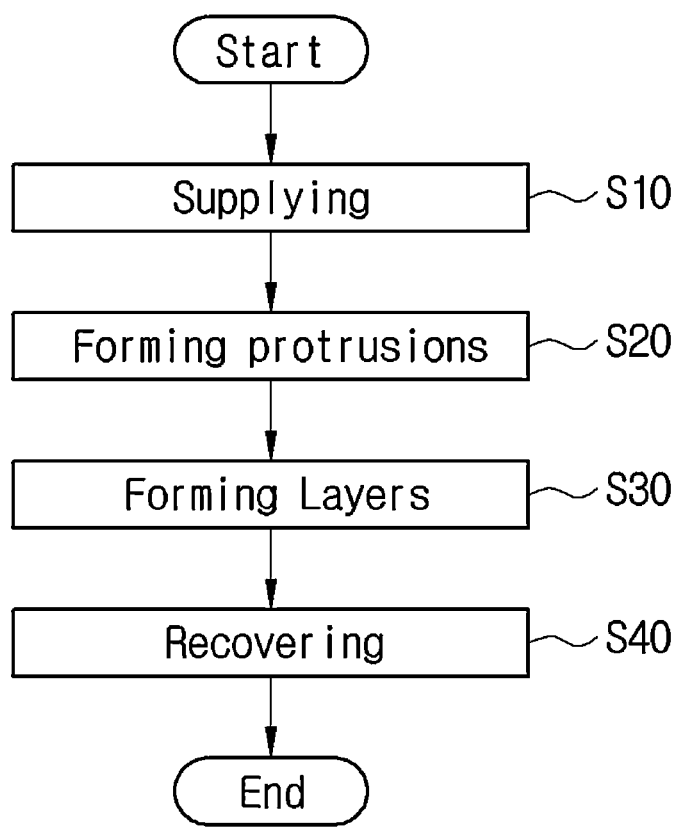
FIG. 4 is a flow chart showing a manufacturing process of the solar cell with the increased power generation area.
Figure 5:
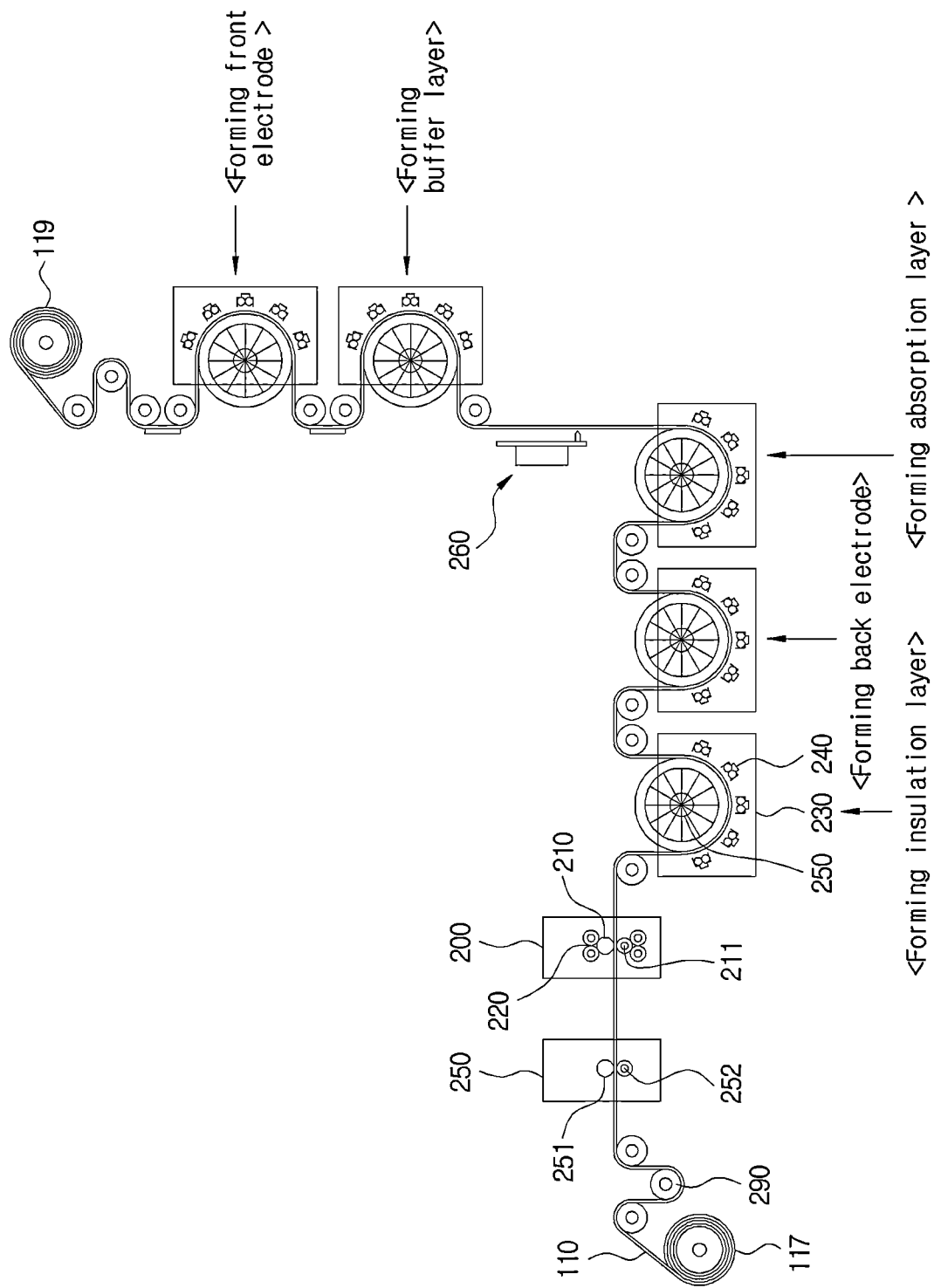
FIG. 5 is an exemplary view showing each device in the manufacturing process of the solar cell.

FIG. 4 is a flow chart showing the manufacturing process of the solar cell with the increased power generation area. FIG. 5 is an exemplary view showing each device in the manufacturing process of the solar cell. Meanwhile, FIG. 6 is an exemplary view showing a rolling unit in detail.

Figure 6:
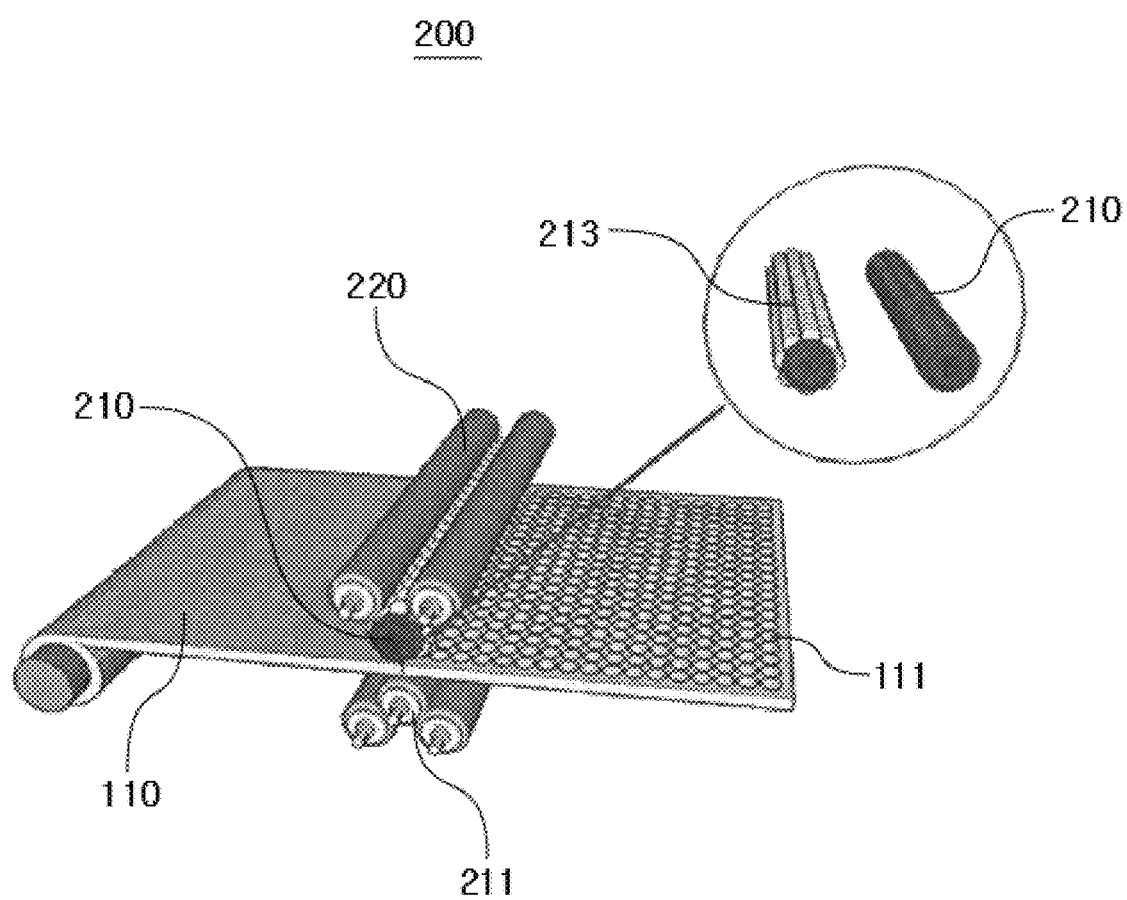
FIG. 6 is an exemplary view showing a rolling unit in detail.

Referring to FIGS. 4 to 6, the method of manufacturing the solar cell of the present invention includes a supply step S10, a protrusion forming step S20, a layer forming step S30, and a recovery step S40.

The supply step S10 is a step in which the substrate 110 is supplied to process devices. The substrate 110 of the present invention and the solar cell manufactured thereby are formed of flexible panels. In particular, the manufacturing of the flexible panels is performed continuously, and a panel having a long length is produced at once. To this end, as described above, in the supply step S10, the stainless steel passes through each process device by transfer rollers 290 while being wound on a supply roll 117 in the form of a roll, and a final panel is wound on a recovery roll 119. To this end, in the supply step S10, the substrate 110 is prepared in the form of a roll and supplied to the transfer roller 290.

The protrusion forming step S20 is a step of forming the protrusion 111 on the substrate 110. To this end, in the protrusion forming step S20, the protrusion 111 is formed by applying pressure to the substrate 110. In regard to the pressure, the protrusion 111 may be formed by applying the pressure onto every predetermined area through a press scheme, and the substrate 110 may be moved forward by a predetermined length according to the above pressure. The above scheme may be used, but the present invention may use a scheme for secure the speed and continuity of continuous processes.

Specifically, according to the present invention, the substrate 110 is passed through a rolling roller 210 provided on a pressing unit 200 to continuously form the protrusion 111 on the substrate 110. A more specific configuration for this is shown in FIG. 6.

As shown in FIG. 6, the substrate 110 is transferred to pass between upper rollers and lower rollers provided in the pressing unit 200, and the protrusion 111 is formed by the rolling roller 210 in the process of passing through the upper and lower rollers.

To this end, the pressing unit 200 is composed of upper rollers and lower rollers. In regard with the upper and lower rollers, for convenience, the rollers disposed over the substrate are referred to as upper rollers, and the rollers disposed under the substrate is referred to as lower rollers.

The rolling roller 210 is provided on any one of the upper roller and the lower roller. In FIG. 6, the rolling roller 210 is shown as being disposed on the top, however, the position may be modified according to a shape and a protruding direction of the protrusion 111. The rolling roller 210 is provided on a surface thereof with a plurality of irregularities 213 for forming the protrusion 111. The irregularities 213 are formed in a shape corresponding to the shape of the protrusion 111. The rolling roller 210 pressurizes the substrate 110 while rotating in synchronization with the transfer of the substrate 110, so that the protrusions 111 are continuously formed.

A support roller 220 is combined with the rolling roller 210. The support roller 220 refers to one or more rollers disposed around the rolling roller 210. FIG. 6 shows an example in which two support rollers 220 are disposed. The support roller 220 serves to enable the rolling roller 210 to smoothly form the protrusion 111, by pressing the rolling roller 210 in close contact with the rolling roller 210. According to the present invention, the case has been take as an example in which a strong metal such as stainless steel is used as the substrate 110, so the example is shown in which a plurality of support rollers 220 are provided. However, when the substrate 110 is a metal softer than stainless steel, the support roller may be omitted or only one support roller 220 may be disposed.

Meanwhile, the lower rollers are disposed to face the upper rollers with the substrate 110 interposed therebetween. The lower rollers serves to enable the rolling roller 210 to accurately press the substrate 110, by pressing the substrate 110 in the direction of the upper rollers. To this end, the lower rollers may include a counter roller 211 and support rollers that supports the counter roller 211. The number of support rollers supporting the counter roller 211 may be omitted or changed according to the type and pressing degree of the substrate 110.

Meanwhile, although the counter roller 211 is shown as having a smooth surface in FIG. 6, the counter roller 211 may also be configured to play a role similar to that of the rolling roller 210. In other words, the counter roller 211 may be formed with a shape corresponding to the rolling roller 110, that is, irregularities corresponding to the shapes formed by pressing the protrusion 110. For example, the corresponding shape may be formed such that a recess is formed at a position of the counter roller 211 corresponding to the position where the protrusion of the rolling roller 210 is formed. Accordingly, an accurate shape of the protrusion may be formed. Further, in the above process, defects of the metal substrate such as stainless steel are compensated. In general, the substrate 110 using a metal is produced by extrusion molding and wound in a roll shape. At this point, the directionality inside the metal, that is, the grains are generated in addition to surface scratches occurring during the extrusion process. The above grains appear in the form of scratches arranged in one direction on the surface. The internal and external grains disappear to a certain level when pressed by the rolling roller during the rolling process.

Accordingly, the occurrence of cracks and the like generated in the process of forming each layer may be reduced during the subsequent process. The rolling roller 210 may exhibit an effect similar when a process such as metal forging is performed. Accordingly, the grains present on the substrate 110 may be removed to a level capable of performing the process.

Meanwhile, in the protrusion forming step S20, before forming the protrusion 111, a step of polishing a surface of a substrate 170 discharged from the supply roller 117 may be performed. To this end, a polishing unit 250 is provided between the pressing unit 200 and the supply roller 117 to polish the substrate 170, so that the surface of the substrate 170 is polished. The polishing unit 250 polishes the surface of the substrate 170 to have a roughness of a predetermined level or less. Accordingly, the polishing unit 250 allows deposition materials to be uniformly applied in the subsequent deposition process, and prevents the unevenness of the deposition layer from occurring due to the rough surface of the substrate 170.

The polishing unit 250 may include a support roller 252 and a polishing roller 251. The substrate 170 passes between the support roller 252 and the polishing roller 251, so that the polishing roller 251 is disposed on the surface on which the following layers are formed.

Meanwhile, in FIG. 5, the polishing unit 250 is shown as being installed in one place, however, a plurality of polishing units 250 may be provided, so that the roughness of the surface of the substrate 170 may be processed to a desired level. For example, when the substrate 170 is stainless steel, the surface may be machined so that the arithmetic mean roughness (Ra) by the centerline average calculation method is 0.03 μm or less, or the ten-point average roughness (Rz) by the ten-point average calculation method is 0.10 μm or less.

The layer forming step S30 is a step in which the insulating layer 120, the back electrode 130, the absorption layer 140, the buffer layer 150, and the front electrode 160 are sequentially formed on the substrate on which the protrusion 111 is formed.

To this end, in the layer forming step S30, layers are formed after passing through a plurality of deposition equipment 230, respectively. However, an annealing device 260 for annealing is provided immediately after the absorption layer 140 is formed, so that annealing treatment is performed on the absorption layer 140.

For forming each of the layers, the deposition is carried out using the shown deposition equipment 230, specifically, sputtering equipment. The deposition equipment 230 of the present invention is configured to continuously input the substrate and form the layers between movements. To this end, the deposition equipment 230 of the present invention includes a drum 250 and a plurality of targets 240 disposed in the transferring direction of the substrate 110 along an outer circumference of the drum 250. Mechanisms for ionizing the target 240 will be omitted for convenience of description.

The drum 250 serves to heat the substrate 110 to a temperature for performing the process while coming into contact with the substrate 110 and transferring the substrate 110 in one direction. In addition, the drum 250 serves to support the substrate 110 during supplying the deposition material to the substrate 110.

The targets 240 are provided with materials for forming each layer, and each layer is formed by colliding the material with a target substrate 110 using a known sputtering method. In particular, according to the present invention, because the substrate 110 moves at a constant speed a plurality of targets provided with a deposition substance of the same material are radially disposed along the transferring direction so as to form an accurate and uniform layer.

This deposition equipment 230 includes a firing furnace (not shown) disposed therein with the drum 250 and the target 240 to isolate the outside and the inside of the equipment.

The deposition equipment is provided with a plurality of deposition equipment as shown in FIG. 5, in which one layer is formed through one deposition equipment. FIG. 5 shows another example in which the insulating layer 120 and the back electrode 130 are sequentially formed in one deposition equipment. The example shows that four deposition equipment 230 are provided, however, five deposition equipment 230 may be provided for a stable process.

In this process, an annealing process using a laser is performed for crystal growth and the like of the absorption layer 140 after the absorption layer 140 is formed. Thereafter, the buffer layer 150 and the front electrode 160 are formed using the deposition equipment 230 again.

In the recovery step S40, the substrate 110 formed with the layers is wound on the recovery roll 119 and recovered.

Thus, according to the present invention, solar cell panels are processed and produced with flexible materials and thicknesses. In addition, the solar cell panels are produced using the process and process equipment suitable for the flexibility of solar cell panels, so that fast and efficient production can be facilitated unlike conventional standardized panels. In particular, the protrusion 110 is formed on the substrate to produce the solar cell panel with an improved power generation area, so that the unit cost of power generation by reducing production cost and increasing power production can be reduced. Further, the solar cell panels are produced as flexible panels, so that the existing solar power facilities can be replaced, and fields and places, in which the conventional solar panels could not be used, can be applied, and thus the usability of solar power generation can be improved.

Although the present invention has been specifically shown and described with reference to exemplary embodiments thereof to illustrate the technical idea of the present invention, the present invention is not limited to the same configurations and operations as those of the above-described specific embodiments, and various modifications may be made without departing from the scope of the present invention. Therefore, it will be apparent that the above modifications are construed to be within the scope of the invention, and the scope of the present invention will be determined by the following claims.

What is claimed is:

1. A method of manufacturing a solar cell, the method comprising:
   a substrate supply step;
   a protrusion forming step of forming a protrusion on a substrate;
   a step of sequentially forming a plurality of layers constituting a solar cell on the substrate on which the protrusion is formed; and
   recovering the substrate on which the layers are formed, wherein
   the substrate supply step or the substrate recovery step includes winding the substrate in a form of a roll, and the protrusion forming step includes pressing the substrate by rotating a rolling roller formed on a surface thereof with a plurality of irregularities to form the protrusion, wherein the protrusions are alternately formed to protrude from front and rear surfaces of the substrate, respectively and spaced apart from neighboring protrusions to have a gap, both a crest of each protrusion and a side part connected between the crest and a valley as a gap portion are rounded to prevent a pointed portion from being formed in the valley between an end of each protrusion and the protrusion, the crest portion is formed in an arc or flat shape so that the protrusion is formed in a disc shape or an inflection point is rounded, the gap formed between the protrusions in the layers becomes gradually narrower upward, and the protrusions are formed at intervals calculated in consideration of thicknesses of the layers laminated on the substrate.

2. The method of claim 1, wherein the step of forming the layers includes a plurality of deposition equipment disposed on a moving path of the substrate determined by a transfer roller to sequentially form the layers.

3. The method of claim 2, wherein the deposition equipment includes:
- a drum disposed inside a firing furnace, and mounted thereon with the substrate to heat the mounted substrate during transfer; and
- a target spaced apart from an outer circumference of the drum, and having a material for forming any one of the layers.

4. The method of claim 3, wherein the target is provided with a plurality of targets along the moving path of the substrate.

5. The method of claim 2, wherein the step of forming the layers includes performing a post-processing by an annealing equipment on the substrate on which the one of the layers is formed.

* * * * *